United States Patent
Masao

[19]

[11] Patent Number: 5,557,239
[45] Date of Patent: Sep. 17, 1996

[54] DIRECT CURRENT OFFSET COMPENSATING CIRCUIT OF AN AUDIO SYSTEM

[75] Inventor: Gibo Masao, Suwon-city, Rep. of Korea

[73] Assignee: Samsung Electronics Co., Ltd., Kyungki-do, Rep. of Korea

[21] Appl. No.: 432,465

[22] Filed: May 1, 1995

[30] Foreign Application Priority Data

Aug. 12, 1994 [KR] Rep. of Korea .................. 20367/1994

[51] Int. Cl.$^6$ ...................................................... H03F 3/45
[52] U.S. Cl. ........................................... 330/259; 330/290
[58] Field of Search .............................. 330/9, 259, 290

[56] References Cited

U.S. PATENT DOCUMENTS

| | | | |
|---|---|---|---|
| 3,444,472 | 5/1969 | Johnson | 330/259 X |
| 4,024,462 | 5/1977 | Highnotes et al. | 330/259 |
| 4,229,703 | 10/1980 | Bustin | 328/162 |
| 4,251,803 | 2/1981 | Debord et al. | 340/347 |
| 4,300,062 | 11/1981 | Marshall, Jr. | 307/304 |
| 4,306,196 | 12/1981 | Dwarakanth et al. | 330/9 |
| 4,308,504 | 12/1981 | Ida | 330/259 X |
| 4,322,687 | 3/1982 | Dwarakanath et al. | 330/9 |
| 4,342,005 | 7/1982 | Harford | 330/259 X |
| 4,363,977 | 12/1982 | Tsuda et al. | 307/358 |
| 4,425,551 | 1/1984 | Blackmer et al. | 330/261 |
| 4,495,470 | 1/1985 | Bristol | 330/9 |

FOREIGN PATENT DOCUMENTS 183511  10/1984  Japan ..................................... 330/259

*Primary Examiner*—James B. Mullins
*Attorney, Agent, or Firm*—Sughrue, Mion, Zinn, Macpeak & Seas

[57] ABSTRACT

The present invention relates to a direct current offset compensating circuit for compensating a DC offset value of an output audio signal in an audio processing system, so that the offset becomes perfectly zero balanced. This perfect zero balance is accomplished by dually detecting the offset of the output audio signal at an output terminal of the audio system. In the direct current offset compensating circuit, the DC offset of the output audio signal is detected and compensated for by using a feedback signal. The DC offset is detected and controlled with the feedback signal so that the DC balance is maintained at DC level of zero. Accordingly, tone quality of the high-grade amplifier is improved by eliminating distortion caused by the DC offset of the audio signal, where the DC offset arises from asymmetry between the positive and negative power values of the output signal.

7 Claims, 2 Drawing Sheets

DIRECT CURRENT OFFSET COMPENSATING CIRCUIT OF AN AUDIO SYSTEM

BACKGROUND OF THE INVENTION

The present invention relates to a direct current (DC) offset compensating circuit for use in an audio processing system. More particularly it relates to a DC offset compensating circuit for detecting a DC offset at an output terminal of a high-quality high-fidelity (Hi-Fi) amplifier and for compensating therefor.

Generally, in an audio system hi-fi amplifier, a coupling capacitor is not used since it causes a degradation in tone quality. While degradation in tone quality can be prevented in such a case where a coupling capacitor is not used, the resulting DC offset caused by asymmetry in positive and negative power swings of the output signal causes distortion in tone quality. Therefore, in order to improve tone quality it is desirable to compensate for the resulting DC offset.

FIG. 1 is a diagram of a conventional DC offset compensating circuit. A signal input through an input terminal P1 is applied to the gate of a transistor Q1, and this signal is applied, respectively, to the bases of transistors Q5 and Q6 via a differential amplifier which includes transistors Q1 to Q4. The signal applied to transistors Q5 and Q6 is differentially amplified and output through resistor R7. When the signal is differentially amplified by transistors Q5 and Q6, transistors Q9 and Q10 apply a reference level to each of their own bases by way of a Zener diode ZD1, thereby controlling a differentially amplified output signal in a uniform manner. The signal differentially amplified by transistors Q5 and Q6 is applied to the base of a transistor Q7, thereby driving transistor Q7. This signal is output to an output terminal OUT of the audio amplifier through a resistor R9. The offset of the signal output to output terminal OUT is the most dominant component of the signal responsible for impairing the tone quality of the hi-fi amplifier etc., and therefore, it is desirable to compensate for this offset.

Accordingly, in the conventional DC offset compensating circuit the signal output to output terminal OUT is fed back to a negative terminal (−) of an operational amplifier OP1 through a resistor R14. Operational amplifier OP1 detects the amount by which the output signal deviates from a "0" level. More specifically, a positive terminal of operational amplifier OP1, is connected to a resistor R15 and a capacitor C2, which thereby defines a time constant value for a reference level.

Operational amplifier OP1 detects the case in which the offset of the output signal deviates slightly in a negative(−) direction from a "0" voltage. Upon detecting such a deviation, operational amplifier OP1 outputs an inverted form of the detected offset. The signal output from operational amplifier OP1 is applied to the base of transistor Q6 and to a drain of transistor Q3, which then causes the bias to shift to a positive(+) value. That is, in transistors Q5 and Q6 the DC balance moves to the positive(+) side of the "0" voltage level. Thereby, the negative(−) DC offset value applied to the negative terminal (−) of operational amplifier OP1 moves towards the "0" level so as to be compensated, thereby maintaining an overall DC balance at the "0" level.

As described above in regards to the conventional offset compensation circuit, since an offset remains in the detection feedback loop of operational amplifier OP1, the circuit is limited in achieving a perfect DC offset compensation, even though this offset is compensated to be near to the "0" level. Therefore, the audio system hi-fi amplifier employing the conventional offset compensation circuit suffers from the problem of inferior tone quality.

SUMMARY OF THE INVENTION

It is therefore, an object of the present invention to provide a DC offset compensating circuit for solving the above-mentioned problem.

It is another object of the present invention to provide a DC offset compensating circuit for dually detecting an offset in the signal output at the audio output terminal in an audio system, and compensating for the DC offset so that the offset becomes perfectly zero balanced, or in other words, is eliminated.

In accordance with the present invention for achieving the above objects, the compensating circuit is comprised of a driving circuit for inputting an input audio signal, differentially amplifying the signal and outputting the amplified signal including a direct current offset value; a first offset compensating circuit for detecting the direct current offset value output from said driving circuit and controlling the driving circuit to maintain a direct current zero balance; and a second offset compensating circuit for detecting the direct current offset value output from said driving circuit, and controlling the driving circuit to maintain the direct current zero balance when the direct current offset value is not compensated to the direct current zero balance by said first offset compensating circuit.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE PREFERRED EMBODIMENT

In the following description, numerous specific details are set forth to provide a more thorough understanding of the present invention. It will be apparent, however, to one skilled in the art, that the present invention may be practiced without these specific details. In other instances well known circuits have not been described so as not to obscure the present invention.

Figure 1:
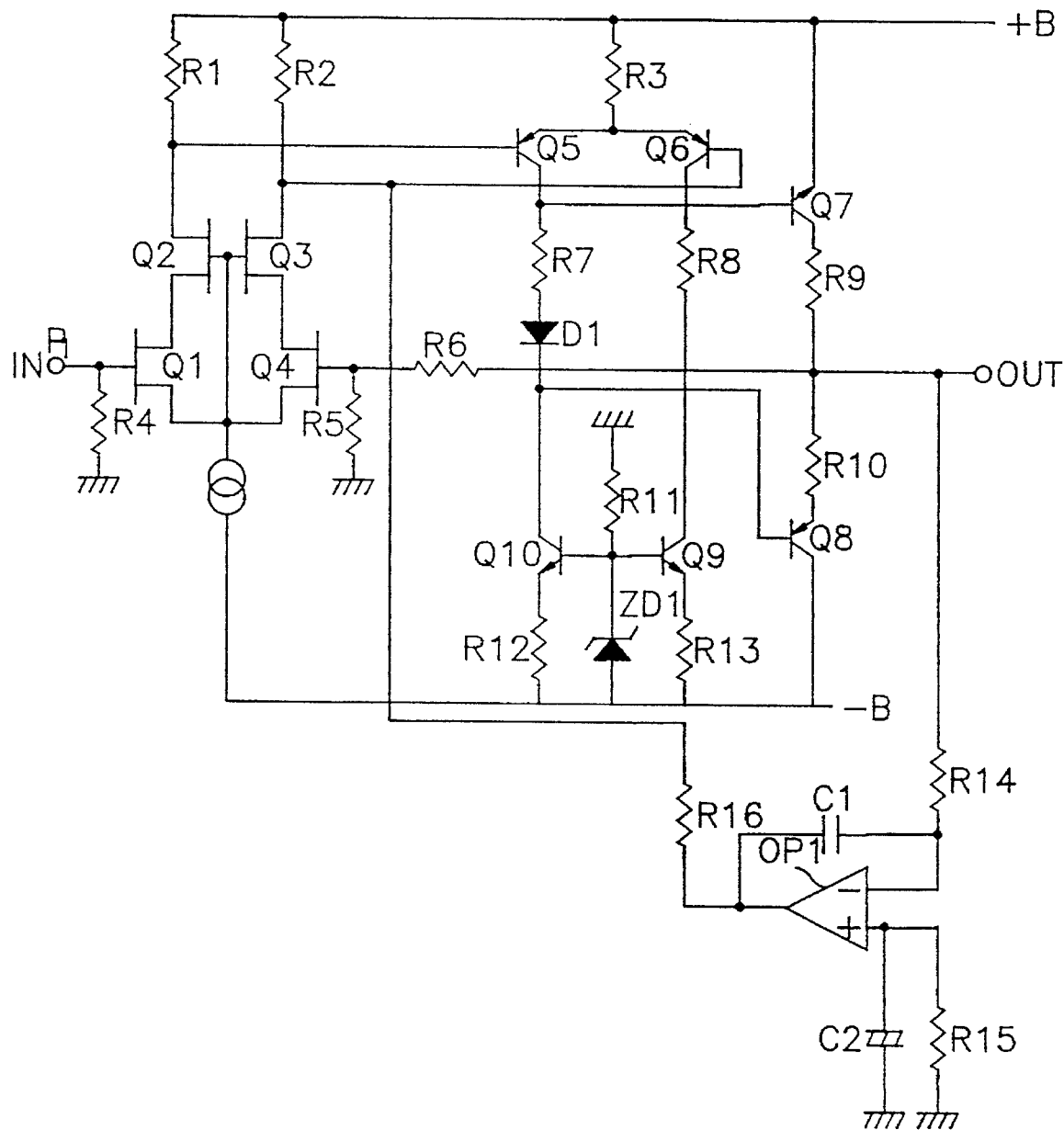
FIG. 1 is a diagram showing a conventional DC (direct current) offset compensating circuit.
Figure 2:
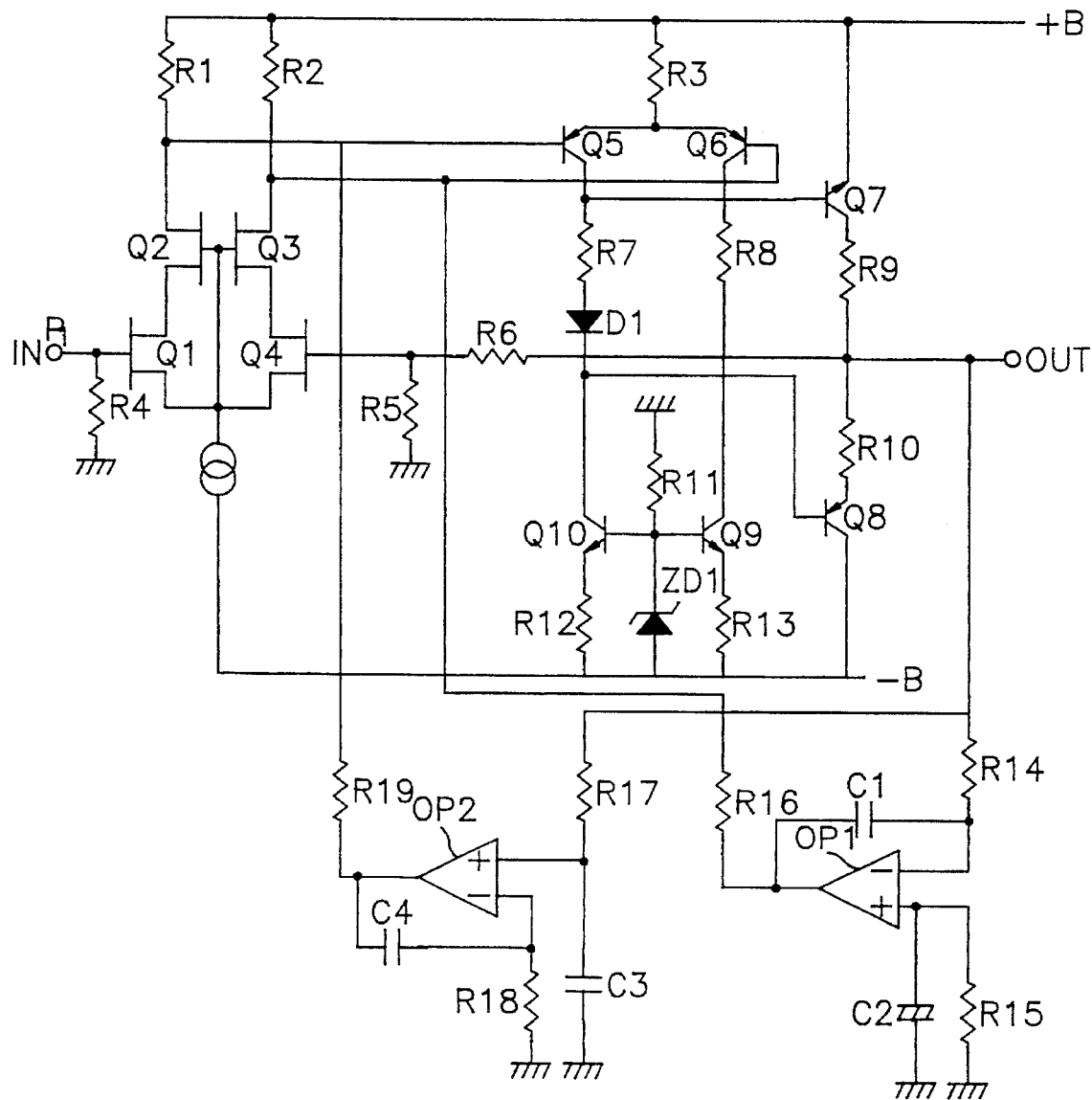
FIG. 2 is a diagram showing the DC offset compensating circuit according to the present invention.

FIG. 2 is a diagram of the DC (direct current) offset compensating circuit according to the present invention. The circuit is comprised of a driving device having transistors Q1 to Q6 and resistors R1 to R8 for inputting an input audio signal, and for differentially amplifying the signal and outputting an audio signal which contains a DC offset value. The circuit also includes a buffer device which has transistors Q7 and Q8 and resistors R9 and R10 for stabilizing the audio signal and DC offset value output from the driving device and for outputting the output signal. Also included is a first offset compensating device having resistors R14 and R15, capacitors C1 and C2 and an operational amplifier OP1 for detecting the DC offset value stably output from the buffer device and for controlling the output signal to maintain the DC offset at a level of zero, or in other words at a DC zero balance. Further, the circuit includes a second offset compensating device having resistors R17 to R19, capacitors C3 and C4 and an operational amplifier OP2 for detecting the DC offset value stably output from the buffer device, and for controlling the output signal so that a DC zero balance may be maintained in the case where the first offset compensating device does not fully compensate the output signal so as to maintain a DC zero balance.

Referring to the aforementioned FIG. 2, an embodiment of the present invention is described in detail. A signal input through an input terminal P1 is applied to the gate of transistor Q1 which is a part of the differential amplifier comprised of transistors Q1 through Q4. The differential amplifier outputs the signal to the bases of transistors Q5 and Q6, where it is differentially amplified and output through resistor R7. When the signal is differentially amplified by transistors Q5 and Q6, transistors Q9 and Q10 apply a reference level to their own bases via a Zener diode ZD1 which controls the output so that a differentially amplified output level may be uniformly maintained. The signal differentially amplified by transistors Q5 and Q6 is applied to the base of transistor Q7 thereby driving transistor Q7, then the signal is output to output terminal OUT through resistor R9.

The DC offset of the signal output to output terminal OUT is the most dominant factor in impairing the tone quality in a hi-fi amplifier, etc. The present circuit compensates for this offset. Accordingly, the signal output to output terminal OUT is applied to the negative terminal (−) of operational amplifier OP1 through resistor R14, and the operational amplifier OP1 detects an amount of deviation from the "O" level. That is, the positive terminal of operational amplifier OP1 is connected to resistor R15 and capacitor C2, thereby defining a time constant value for a reference level. Operational amplifier OP1 detects the case in which the offset slightly deviates to a negative(−) side of the "O" voltage level. After detecting the slight offset, operational amplifier OP1 inverts and outputs the offset signal. The signal output from operational amplifier OP1 is applied to the base of transistor Q6 and to the drain of transistor Q3, causing the bias to shift to a positive(+) value. That is, in transistors Q5 and Q6 a DC balance moves in a positive(+) direction from the "O" voltage level, and thereby a negative(−) value applied to the negative terminal (−) of operational amplifier OP1 moves near to the "O" level so as to be compensated therefor, thus, the overall DC balance is maintained at the "O" level.

Meanwhile, since operational amplifier OP1 itself includes the offset, the compensation is limited in that it cannot perfectly compensate for the DC offset, even though the offset is compensated to near the "0" level. Accordingly, when operational amplifier OP1 does not perfectly compensate the signal to the "O" level, an operational amplifier OP2 is employed to differentially amplify that portion of the signal not fully balanced to the "O" balance level. Operational amplifier OP2 outputs the signal to the base of transistor Q5 in order to maintain the DC balance at the "O" level.

In particular, the signal output to output terminal OUT is applied to a positive terminal(+) of operational amplifier OP2 through resistor R17. The operational amplifier OP2 detects the offset, or in other words, the amount of deviation from the "O" level. For example, in operational amplifier OP2, a negative terminal(−) is connected with resistor R18 and capacitor C4, in which the time constant value for the reference level is determined. Operational amplifier OP2 detects the case in which the signal slightly deviates to the positive side (+) of the "0" voltage level and outputs a compensation signal. The compensation signal output from operational amplifier OP2 is applied to the base of transistor Q5 and to a drain of transistor Q2, then the bias is shifted to a negative(−) value. That is, in transistors Q5 and Q6 the DC balance moves towards the "O" level from a positive(+) level, and thereby the positive(+) value applied to the positive terminal(+) of operational amplifier OP2 moves close to "O" so as to be compensated, and then the entire DC balance of the output signal is maintained at the "O" level.

As set forth above, the present invention detects the DC offset in the an output signal of the audio amplifier and supplies the DC balance via a feedback loop. Also, the present invention detects the DC offset of the amplifier for executing feedback, and it controls the circuit so that the DC balance may be maintained at a zero level. Thereby, distortion of the output signal is prevented because the DC offset is eliminated. Accordingly, the present invention has the advantage that the tone quality in an amplifier of the highest grade, etc. can be improved.

What is claimed is:

1. A direct current offset compensating circuit for an audio system, comprising:

a driving circuit for inputting an input audio signal, differentially amplifying the signal and outputting the amplified audio signal including a direct current offset value;

a first offset compensating circuit for detecting the direct current offset value output from said driving circuit and controlling the driving circuit to maintain a direct current zero balance, while the audio signal is input to said driving circuit; and a second offset compensating circuit for detecting the direct current offset value output from said driving circuit, and controlling the driving circuit to maintain the direct current zero balance when the direct current offset value is not compensated to the direct current zero balance by said first offset compensating circuit, while the audio signal is input to said driving circuit.

2. The direct current offset compensating circuit as claimed in claim 1, wherein said first offset compensating circuit detects the direct current offset value which deviates in a first direction, and controls the driving circuit so that the detected direct current offset value becomes zero.

3. The direct current offset compensating circuit as claimed in claim 2, wherein the first direction is a direction toward a negative direct current level.

4. The direct current offset compensating circuit as claimed in claim 2, wherein said second offset compensating circuit detects the direct current offset value, which deviates in a second direction, and controls the driving circuit so that the detected direct current offset value becomes zero.

5. The direct current offset compensating circuit as claimed in claim 4, wherein the second direction is a direction toward a positive direct current level.

6. A direct current offset compensating circuit for an audio system, having a driving circuit for inputting an input audio signal, differentially amplifying the signal and outputting a direct current offset value to an output terminal, comprising:

a first resistor connected to the output terminal and a negative terminal of a first operational amplifier;

a first capacitor connected between the negative terminal and an output terminal of the operational amplifier;

a second capacitor and second resistor connected in parallel between a positive terminal of said operational amplifier and a ground potential, wherein the output terminal of said operational amplifier is connected to a first balance control terminal of said driving circuit;

a third resistor having a first end connected to the output terminal of said audio amplifier and a second end connected to a first end of a third capacitor and a second end of the third capacitor connected to the ground potential; and a second operational amplifier having a positive terminal connected to said second end of said third resistor, a negative terminal connected to the ground potential through a fourth resistor, and an output terminal connected to second balance control terminal of said driving circuit, wherein a fourth capacitor is connected between the negative terminal and the output terminal of said operational amplifier.

7. A direct current offset compensating circuit for an audio system, having an audio amplifier output terminal for outputting an audio signal having a direct current offset value, the direct current offset compensating circuit comprising:

a driving circuit for amplifying an input audio signal;

a buffer circuit for outputting the amplified signal;

a first offset compensation device, having an output connected to the driving circuit, for detecting an offset in the output audio signal while the audio signal is input to said driving circuit, generating and outputting a first compensation signal based on the detected offset signal, wherein the driving circuit compensates for the direct current offset in the output audio signal based on the output of the first offset compensation device;

a second offset compensation device, having an input terminal connected to the audio amplifier output terminal and an output terminal connected to the driving circuit, for detecting the direct current offset in the output audio signal while the audio signal is input to said driving circuit, generating and outputting a second compensation signal based on the detected offset signal, wherein the driving circuit compensates for the direct current offset in the output audio signal based on the output of the second offset compensation device.

* * * * *